United States Patent [19]
Choi et al.

[11] Patent Number: 6,108,259
[45] Date of Patent: Aug. 22, 2000

[54] NONVOLATILE SEMICONDUCTOR MEMORY DEVICE

[75] Inventors: Soo-Hwan Choi; Young-Ho Lim, both of Suwon, Rep. of Korea

[73] Assignee: Samsung Electronics, Co., Ltd., Suwon, Rep. of Korea

[21] Appl. No.: 09/333,524

[22] Filed: Jun. 14, 1999

[30] Foreign Application Priority Data

Jun. 12, 1998 [KR] Rep. of Korea .................. 98-22100

[51] Int. Cl.$^7$ ................................. G11C 7/00
[52] U.S. Cl. ............. 365/210; 365/185.11; 365/185.2; 365/185.21
[58] Field of Search .................. 365/210, 185.11, 365/185.2, 185.21, 230.03

[56] References Cited

U.S. PATENT DOCUMENTS

| | | | |
|---|---|---|---|
| 5,088,064 | 2/1992 | Tsukude | 365/210 |
| 5,754,475 | 5/1998 | Bill et al. | 365/185.2 |
| 5,943,286 | 8/1999 | Oritz | 365/185.2 |
| 5,982,666 | 11/1999 | Campardo | 365/185.2 |

*Primary Examiner*—Tan T. Nguyen
*Attorney, Agent, or Firm*—Marger Johnson & McCollom, P.C.

[57] ABSTRACT

A semiconductor memory device includes a plurality of memory cell blocks having a plurality of memory cells, a plurality of sense amplifiers coupled to the memory cell blocks, and a reference block for generating a reference value and for providing the reference value to the sense amplifiers. Each memory cell block is coupled to at least one of the sense amplifiers. The reference block includes a reference cell for holding a predetermined reference value and a current circuit responsive to a state of the reference cell.

12 Claims, 3 Drawing Sheets

1

NONVOLATILE SEMICONDUCTOR MEMORY DEVICE

FIELD OF THE INVENTION

The invention relates to a nonvolatile semiconductor memory device and, more particularly, to a nonvolatile semiconductor memory device in which sense amplifiers are coupled to a single reference memory cell block.

BACKGROUND OF THE INVENTION

Many computing systems, such as personal computers, automotive an airplane control systems, cellular phones, digital cameras, and hand-held communication devices, use nonvolatile writeable memories to store either data or code, or both. Such nonvolatile writeable memories include flash EEPROMs (Electrically Programmable and Erasable Read-Only-Memories; hereinafter referred to as "flash memories"). Non-volatility is advantageous in that it allows the computing system to retain its data and code even when power to the computing system is interrupted. Thus, even if the system is turned off or even if there is a power failure, no code or data loss occurs.

Flash memories have shown more advanced performance in accessing data, than any other kind of nonvolatile memories, such as EEPROMs, for a reading and writing (or programming). The merit of high speed operation in the flash memory has been regarded to be very useful in the fields of the products aforementioned. In general, there are two kinds of flash memory: NAND-type, in which memory cells are connected from a bit line in serial, and NOR-type in which memory cells are connected to a bit line in parallel. It is well known that the NOR-type flash memory has faster data access, which makes the NOR-type be more advantageous in a high frequency memory system than the NAND-type. In the NOR-type flash memories, a data state of a memory cell is detected by a sense amplifier, comparing with a predetermined reference value. Stabilizing the detecting operation may become more critical than any other factors in the NOR-type flash memories.

The flash memory of FIG. 1, shows one memory block 100, out of a plurality of memory blocks in a memory cell array of a flash memory device, and the peripheral circuit blocks. Those include a first control circuit 110, a reference cell block 200, a second control circuit 210, a sense amplifier 300, and a high voltage generation circuit 400. First control circuit 110 is composed of circuits for driving and controlling the operations of programming, erasing, reading, and verifying for the memory block. Reference cell block 200 makes cell current, i.e. reference current, with respect to the detecting current through a selected memory cell of the memory block and then applies the reference current to sense amplifier 300. Second control circuit 210 performs the operations of programming, erasing, reading, and verifying for a selected cell of reference cell block 200. Sense amplifier 300 receives the detected cell current supplied from the memory and reference cell blocks, 100 and 200, and establishes the logic levels involved in the cell states by comparing the difference between them.

Each of the sense amplifiers, such as 300, is connected to one memory block and one reference cell block. The flash memory includes a plurality of the memory and reference cell blocks, and thereby plural sense amplifiers must be arranged therein to access the data from the memory blocks. The number of the sense amplifiers are, as usual, determined by the capacity of data output transmission in one cycle time of reading, and causes the number of the reference cell blocks and the second control circuits to be increased likewise. For instance, sixteen sense amplifiers in a flash memory device would need sixteen reference cell blocks and second control circuits therein. Such an increase in the number of reference cell portions causes an increase of cell size of the device.

Each reference block for each sense amplifier could deviate from a constant reference for sensing data of memory cells, because of differences between reference cells of the separated reference blocks.

It is important to maintain a constant reference value for detecting cell data. After programming or erasing, a memory cell is held in the state of off-cell or on-cell, and to determine whether a selected memory cell is an off-cell or an on-cell is accomplished by comparing a potential of the selected memory cell to a potential supplied from the reference cell of the reference cell block. Thus, if the reference values held in the reference cell blocks are different from one another, an erroneous function would occur during a reading operation.

SUMMARY OF THE INVENTION

It is therefore an object of the present invention to provide a semiconductor memory device that can reduce a chip area despite having a plurality of sense amplifiers.

It is another object of the invention to provide a semiconductor memory device capable of performing a reliable sensing operation with a plurality of reference cells.

It is still another object of the invention to provide a nonvolatile semiconductor memory device without a chip area increasing despite of a plurality of sense amplifiers.

It is still another object of the invention to provide a nonvolatile semiconductor memory device capable of performing a reliable sensing operation with a plurality of reference cells.

In order to accomplish those objects, a semiconductor memory device of this invention includes a plurality of memory cell blocks having a plurality of memory cells, a plurality of sense amplifiers coupled to the memory cell blocks, and a reference block for generating a reference value and for providing the reference value to the sense amplifiers. At least each of the sense amplifiers is coupled to each of the memory cell blocks. The reference block includes a reference cell for holding a predetermined reference value and a current circuit for responding a state of the reference cell.

According to another aspect of the invention, a semiconductor memory device includes a plurality of memory cell blocks having a plurality of memory cells; a plurality of sense amplifiers coupled to the memory cell blocks, at least each of the sense amplifiers being coupled to each of the memory cell blocks; a reference block for generating a reference value and for providing the reference value to the sense amplifiers, the reference block comprising a reference cell for holding a predetermined reference value and a current circuit for responding a state of the reference cell; and a plurality of reference driving circuits for transferring the reference value to the sense amplifiers, each of the reference driving circuits being coupled to an input of one of the sense amplifiers.

The current circuit is a current mirror circuit whose input is connected to the reference cell, and the reference cell is corresponding to a memory cell of the memory cell block. The reference cell is a floating gate transistor identical to the memory cell.

Each of the reference driving circuits includes a NMOS transistor which is connected between the input of the sense amplifier and a power voltage, a gate of the NMOS transistor being coupled to an output of the reference block.

More specifically, the invention is accomplished by a semiconductor memory device including: N-numbered memory cell blocks having a plurality of memory cells; N-numbered sense amplifiers coupled to the memory cell blocks, at least each of the sense amplifiers being coupled to each of the memory cell blocks; and at least one reference block for generating a reference value and for providing the reference value to the sense amplifiers in common, the reference block comprising a reference cell for holding a predetermined reference value and a current circuit for responding a state of the reference cell. In another aspect, a semiconductor memory device of the invention includes N-numbered memory cell blocks having a plurality of memory cells; N-numbered sense amplifiers coupled to the memory cell blocks, at least each of the sense amplifiers being coupled to each of the memory cell blocks; at least one reference block for generating a reference value and for providing the reference value to the sense amplifiers; and N-numbered reference driving circuits for transferring the reference value to the sense amplifiers, each of the reference driving circuits being coupled to an input of one of the sense amplifiers; wherein the N-numbered sense amplifiers shares the reference value provided from the one reference block.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF PREFERRED EMBODIMENTS

Hereinbelow, applicable embodiments of the invention will be as follows, with the appended drawings.

Figure 2:
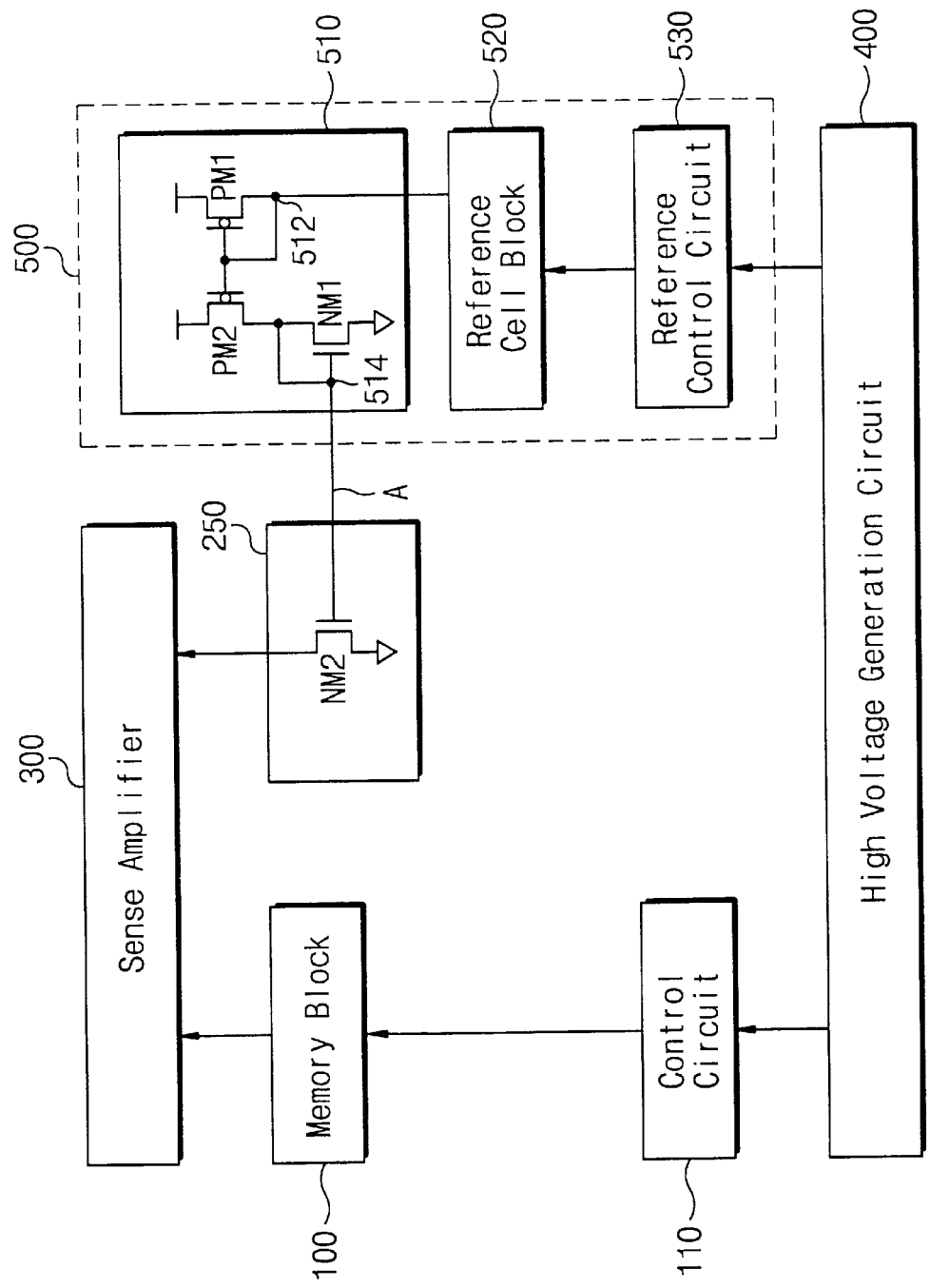
FIG. 2 is a schematic block diagram of the functional structure of the nonvolatile memory device according to the present invention.

FIG. 2 shows a construction of the flash memory device according to an embodiment of the present invention with respect to one memory cell block, out of a plurality of memory cell blocks, being coupled to one sense amplifier for detecting memory cells in the memory cell block.

Figure 1:
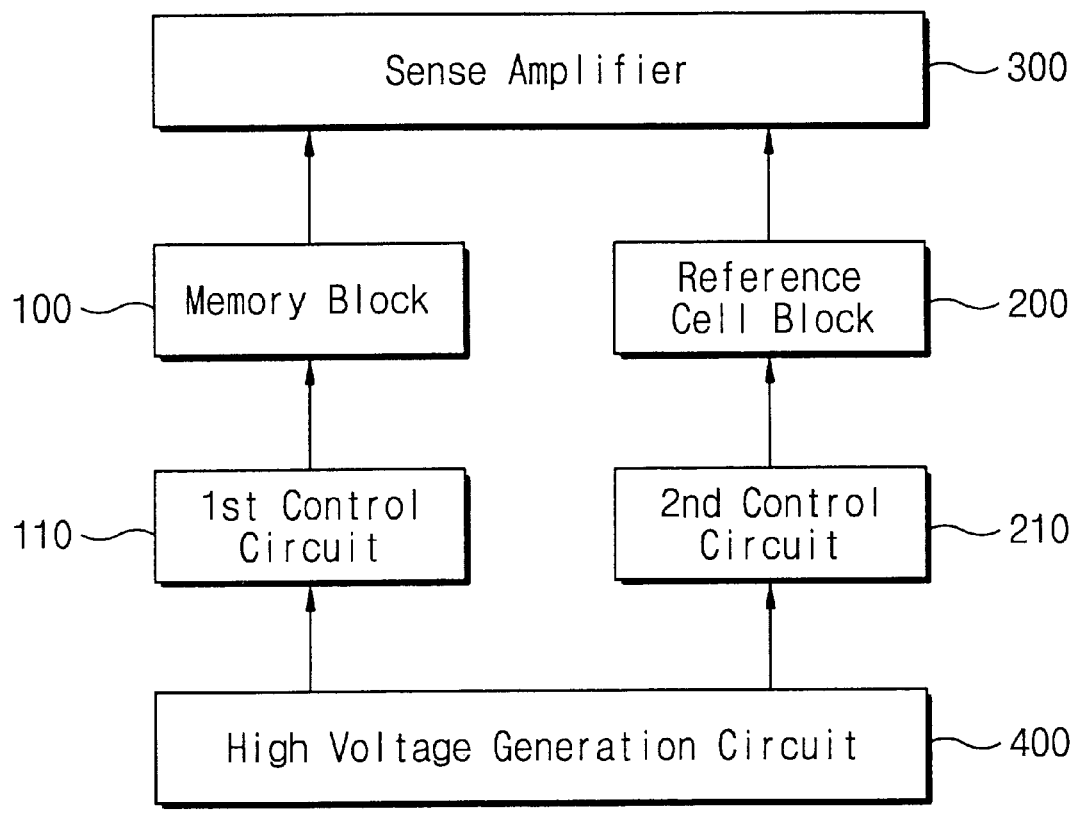
FIG. 1 is a block diagram of a nonvolatile semiconductor memory device.

Referring to FIG. 2, a memory block 100, a control circuit 110, a sense amplifier 300, and a high voltage generation circuit 400 are identical to those of FIG. 1. A reference driving circuit 250 is connected to an input of the sense amplifier 300, transferring a potential supplied from reference cell block 520. The reference driving circuit 250 is formed of, for instance, NMOS transistor NM2, connected between the input of sense amplifier 300 and a ground, the gate of NM2 is coupled to output node 514 of current mirror 510 disposed in reference block 500.

The reference block 500 includes a current mirror circuit 510, a reference cell block 520, and a reference control circuit 530. One reference block 500 corresponds to a plurality of the sense amplifiers, as shown in FIG. 2, while each reference driving circuit 250 is provided to one of the sense amplifiers.

The current mirror circuit 510 transfers a state of a reference cell of reference cell block 520, the reference cell corresponding to a selected memory cell of memory cell block 100, to the gate of NMOS transistor NM2 of reference driving circuit 250. Output node 514, in current mirror circuit 510, is coupled to gate and drain of NMOS transistor NM1 whose source is connected to the ground (or substrate voltage), and connected to a power supply voltage through PMOS transistor PM2 whose gate is coupled to input node 512. Input node 512 is also coupled to gate and drain of PMOS transistor PM1 source of which is connected to the power supply voltage.

Input node 512 of current mirror circuit 510 is substantially connected to a bit line (not shown) which is coupled to a reference cell having a floating gate. The reference cell of a floating-gate type holds a constant potential, and thereby input node 512 of current mirror circuit 510 responds to a state of the reference cell of reference cell block 520, generating a reference cell current flowing from input node 512 of current mirror circuit 510 to the ground through the reference cell of reference cell block 520. The reference cell current is dependent upon the amount of charges held at the floating gate of the reference cell of reference cell block 520. Then, PMOS transistor PM1 flows its channel current proportional to the amount of current flown out from input node 512. The rate of pulling-down at input node 512 determines a current drivability of PMOS transistor PM2. As PMOS transistor PM2 supplies a constant current to output node 514, in response to the pulling-down at the input node, NMOS transistor NM2 whose gate is coupled to output node 514 of current mirror circuit 510 responds thereto. As a result, the NMOS transistor NM2 of reference driving circuit 250 can transfer a reference value set by the reference cell into sense amplifier 300. Therefore, sense amplifier 300 receives a detected value from a selected memory cell of memory block 100, and the reference value derived from the reference cell through NMOS transistor NM2 of reference driving circuit 250, and then generates a sensed data signal which designates a state of the selected memory cell, whether an on-cell or an off-cell, of memory block 100.

Figure 3:
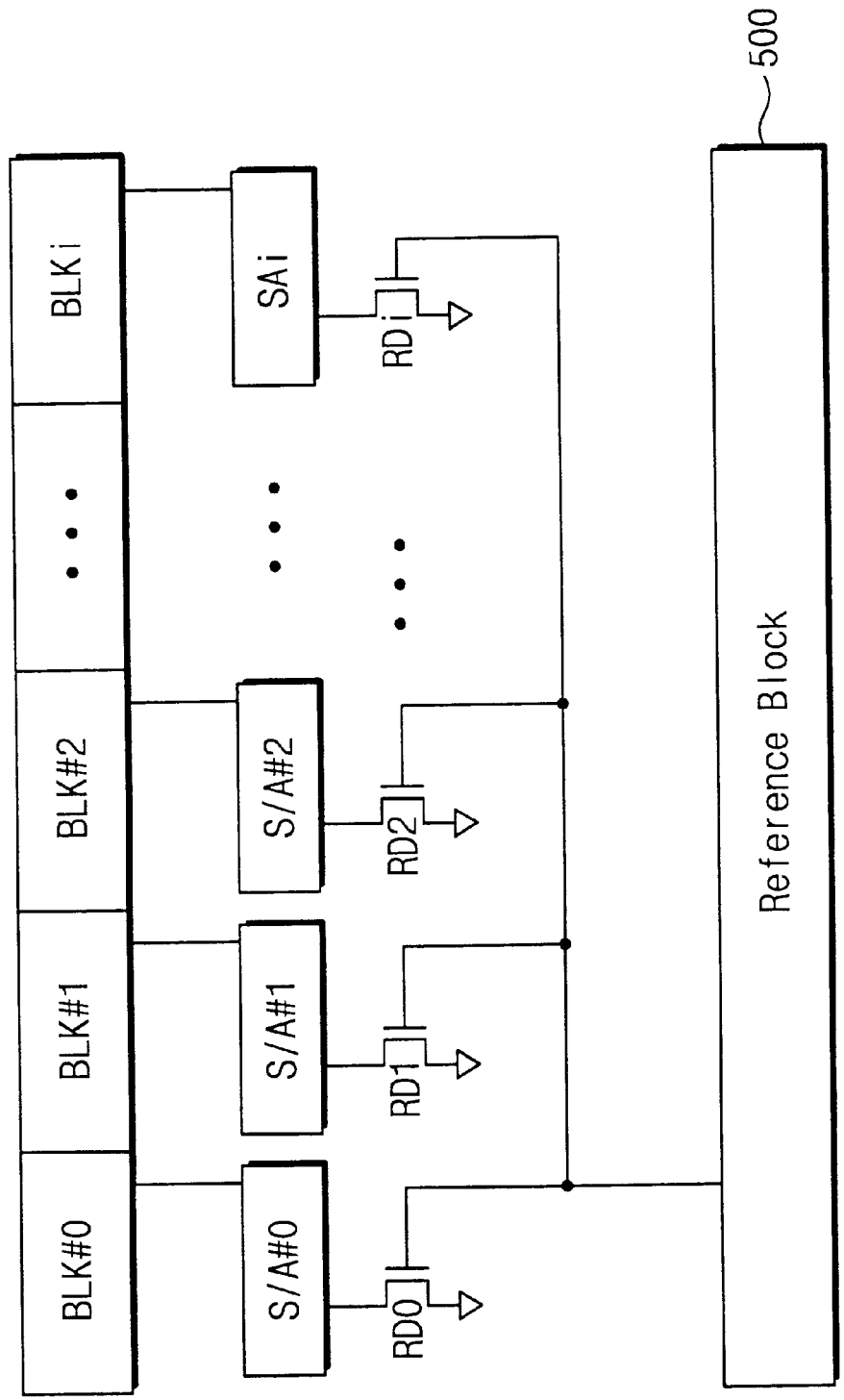
FIG. 3 is a partial diagram showing the functional arrangement including the memory blocks, sense amplifiers, and control circuit.

FIG. 3 simply shows an entire configuration of the present memory device having a plurality of memory cell blocks BLK0–BLKi and sense amplifiers SA0–SAi. It should be noted that any of the memory cell blocks BLK0–BLKi is identical to the memory cell block 100 of FIG. 2, and as is the sense amplifier. Furthermore, it can be seen that a plurality of the NMOS transistor reference driving circuits RD0–RDi shown in FIG. 2, each identical to the reference driving circuit 250 of FIG. 2, are coupled to the sense amplifiers SA0–SAi, respectively. With respect to the construction of memory cell blocks BLK0–BLKi, sense amplifiers SA0–SAi, and reference driving circuit RD0–RDi, a common reference block 500 is provided. Also, reference block 500 of FIG. 3 includes current mirror circuit 510, reference cell block 520, and reference control circuit 530, as shown in FIG. 2. Comparing the structure of FIG. 3 to the conventional device structure of FIG. 1, the conventional device needs a plurality of the reference cell blocks and reference control blocks while the present invention needs only a single reference block such as reference block 500 in FIG. 2. Since all of a plurality of sense amplifiers receive the same reference value to be compared with various data values from memory cells, an erroneous result does not occur in detecting cell states, unlike in the conventional device where the difference between reference cells of the conventional device can cause a detection error.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A semiconductor memory device comprising:
    a plurality of memory cell blocks having a plurality of memory cells;
    a plurality of sense amplifiers coupled to the memory cell blocks, each of the memory cell blocks coupled to at least one of the sense amplifiers; and
    a reference block for generating a reference value and for providing the reference value to the sense amplifiers, the reference block comprising a reference cell for holding a predetermined reference value and a current circuit responsive to a state of the reference cell.

2. A semiconductor memory device of claim 1, wherein the current circuit is a current mirror circuit whose input is connected to the reference cell.

3. A semiconductor memory device of claim 1, wherein the reference cell is corresponding to a memory cell of the memory cell block.

4. A semiconductor memory device comprising:
    a plurality of memory cell blocks having a plurality of memory cells;
    a plurality of sense amplifiers coupled to the memory cell blocks, each of the memory cell blocks coupled to at least one of the sense amplifiers;
    a reference block for generating a reference value and for providing the reference value to the sense amplifiers, the reference block comprising a reference cell for holding a predetermined reference value and a current circuit responsive to a state of the reference cell; and
    a plurality of reference driving circuits for transferring the reference value to the sense amplifiers, each of the reference driving circuits being coupled to an input of one of the sense amplifiers.

5. A semiconductor memory device of claim 4, wherein the current circuit is a current mirror circuit whose input is connected to the reference cell.

6. A semiconductor memory device of claim 4, wherein the reference cell is corresponding to a memory cell of the memory cell block.

7. A semiconductor memory device of claim 4, wherein the reference cell has a floating gate.

8. A semiconductor memory device of claim 4, each of the reference driving circuits includes a NMOS transistor which is connected between the input of the sense amplifier and a power voltage, a gate of the NMOS transistor being coupled to an output of the reference block.

9. A semiconductor memory device comprising:
    N-numbered memory cell block out of a plurality of memory cell blocks each having a plurality of memory cells;
    N-numbered sense amplifier out of a plurality of sense amplifiers coupled to the corresponding N-numbered memory cell block;
    at least one reference block for generating a reference value and for providing the reference value to the sense amplifiers in common, the reference block comprising a reference cell for holding a predetermined reference value and a current circuit responsive to a state of the reference cell.

10. A semiconductor memory device of claim 9, wherein the current circuit is a current mirror circuit whose input is connected to the reference cell.

11. A semiconductor memory device of claim 9, wherein the reference cell is corresponding to a memory cell of the memory cell block.

12. A semiconductor memory device comprising:
    N-numbered memory cell block out of a plurality of memory cell blocks each having a plurality of memory cells;
    N-numbered sense amplifier out of a plurality of sense amplifiers coupled to the corresponding N-numbered memory cell block;
    at least one reference block for generating a reference value and for providing the reference value to the sense amplifiers; and
    N-numbered reference driving circuit out of a plurality of reference driving circuits for transferring the reference value to the corresponding N-numbered sense amplifier, each of the reference driving circuits being coupled to an input of one of the sense amplifiers;
    wherein the reference value provided from the one reference block is shared by the sense amplifiers.

* * * * *